(12) United States Patent
Ayazi et al.

(10) Patent No.: US 8,022,779 B2
(45) Date of Patent: Sep. 20, 2011

(54) INTEGRATED CIRCUIT OSCILLATORS HAVING MICROELECTROMECHANICAL RESONATORS THEREIN WITH PARASITIC IMPEDANCE CANCELLATION

(75) Inventors: Farrokh Ayazi, Atlanta, GA (US); Seyed Hossein Miri Lavasani, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 12/570,592

(22) Filed: Sep. 30, 2009

(65) Prior Publication Data

US 2010/0308930 A1    Dec. 9, 2010

Related U.S. Application Data

(60) Provisional application No. 61/185,356, filed on Jun. 9, 2009.

(51) Int. Cl.
    *H03B 5/30*         (2006.01)
(52) U.S. Cl. ............... 331/154; 331/116 M; 331/185
(58) Field of Classification Search ............ 331/116 M, 331/116 R, 154, 158, 160, 185, 186
See application file for complete search history.

(56) References Cited

U.S. PATENT DOCUMENTS

| | | | |
|---|---|---|---|
| 2,726,370 A | 12/1955 | Linvill et al. | |
| 2,777,115 A | 1/1957 | Linvill | |
| 2,852,680 A * | 9/1958 | Radcliffe, Jr. | 331/115 |
| 3,384,844 A | 5/1968 | Meacham | |
| 3,562,561 A | 2/1971 | Klosterman | |
| 5,438,288 A * | 8/1995 | Delano | 327/65 |
| 5,668,506 A * | 9/1997 | Watanabe et al. | 331/66 |
| 6,064,277 A * | 5/2000 | Gilbert | 331/117 R |
| 6,081,167 A * | 6/2000 | Kromat | 331/108 C |
| 6,667,666 B2 * | 12/2003 | Uzunoglu | 331/173 |
| 6,933,793 B2 * | 8/2005 | Patterson et al. | 331/76 |
| 6,972,635 B2 * | 12/2005 | McCorquodale et al. | 331/167 |
| 7,683,741 B2 * | 3/2010 | Ito et al. | 333/187 |
| 7,733,190 B2 * | 6/2010 | Yajima et al. | 331/107 A |
| 2003/0030497 A1 | 2/2003 | Duncan et al. | |
| 2005/0153677 A1 | 7/2005 | Vorenkamp et al. | |
| 2008/0178682 A1 * | 7/2008 | Wojciechowski | 73/778 |
| 2008/0284919 A1 | 11/2008 | Vorenkamp et al. | |
| 2009/0115552 A1 | 5/2009 | Ito et al. | |

OTHER PUBLICATIONS

Ho et al., "Temperature Compensated IBAR Reference Oscillators," MEMS 2006, Istanbul, Turkey, Jan. 22-26, 2006, pp. 910-913.

Hopcroft et al., "Active Temperature Compensation for Micromachined Resonators," Solid-State Sensor, Actuator and Microsystems Workshop, Hilton Head Island, South Carolina, Jun. 6-10, 2004, pp. 364-367.

(Continued)

*Primary Examiner* — Levi Gannon
(74) *Attorney, Agent, or Firm* — Myers Bigel Sibley & Sajovec

(57) ABSTRACT

An integrated circuit oscillator includes a microelectromechanical (MEM) resonator having input and output terminals. An oscillation sustaining circuit is provided. The oscillation sustaining circuit is electrically coupled between the input and output terminals of the microelectromechanical resonator. The oscillation sustaining circuit includes a sustaining amplifier and a negative impedance circuit electrically coupled to the sustaining amplifier. The negative impedance circuit is configured to increase a tuning range of the oscillator by at least partially cancelling a parasitic shunt capacitance associated with the microelectromechanical resonator.

14 Claims, 4 Drawing Sheets

OTHER PUBLICATIONS

Hsu et al., "Geometric Stress Compensation for Enhanced Thermal Stability in Micromechanical Resonators," 1998 IEEE Ultrasonics Symposium, pp. 945-948.

Lavasani et al., "A 145MHz Low Phase-Noise Capacitive Silicon Micromechanical Oscillator," IEEE International Electron Devices Meeting, Dec. 2008, pp. 675-678.

Linvill, J.G., "Transistor Negative-Impedance Converters," Proceedings of the I.R.E., Jun. 1953, pp. 725-729.

Sundaresan et al., "A Low Phase Noise 100 MHz Silicon BAW Reference Oscillator," IEEE 2006 Custom Integrated Circuits Conference (CICC), pp. 841-844.

* cited by examiner

INTEGRATED CIRCUIT OSCILLATORS HAVING MICROELECTROMECHANICAL RESONATORS THEREIN WITH PARASITIC IMPEDANCE CANCELLATION

REFERENCE TO PRIORITY APPLICATION

This application claims priority to U.S. Provisional Application Ser. No. 61/185,356, filed Jun. 9, 2009, the disclosure of which is hereby incorporated herein by reference.

FIELD OF THE INVENTION

The present invention relates to integrated circuit devices and, more particularly, to micro-electromechanical devices and methods of operating same.

BACKGROUND OF THE INVENTION

Reference frequency oscillators play a significant role in the performance of modern integrated circuit devices and systems. With the development of integrated low-loss (e.g., <1 kΩ) microelectromechanical resonators, circuit designers are able to develop microelectromechanical oscillators to deliver highly-stable and low-jitter clock signals with smaller form-factor and lower power than oscillators using quartz crystals.

Despite their short-term and long-term stability, microelectromechanical oscillators may suffer from inferior frequency accuracy compared to quartz crystals, both in terms of temperature stability and manufacturing tolerance. For example, the relatively large temperature coefficient of frequency (TCF) of many microelectromechanical oscillators may cause significant frequency drift over a commercial temperature range. This relatively high level of frequency drift may make microelectromechanical resonators unacceptable for many applications, including those requiring ±50 ppm of accuracy. To address this potential limitation associated with microelectromechanical resonators, temperature compensation techniques have been developed. Some of these temperature compensation techniques, which include electrical compensation and material compensation, are disclosed in articles by K. Sundaresan et al., entitled "A Low Phase Noise 100 MHz Silicon BAW Reference Oscillator," Proceedings of the Custom Integrated Circuits Conference, pp. 841-844, Sep. 10-13 (2006); H. M. Lavasani et al., entitled "Low Phase-Noise UHF Thin-Film Piezoelectric-on-Substrate LBAR Oscillators," Proc. IEEE MEMS, pp. 1012-1015, January (2008); G. Ho et al., entitled "Temperature Compensated IBAR Reference Oscillators," Proc. IEEE-ASME MEMS 2006, pp. 910-913, Jan. 22-26, 2006; and H. M. Lavasani et al., "A 145 MHz Low Phase-Noise Capacitive Silicon Micromechanical Oscillator," IEEE IEDM, pp. 675-678, December (2008). The disclosures of these articles are hereby incorporated herein by reference.

As these articles describe, frequency tuning in microelectromechanical oscillators can be achieved by varying the resonance frequency of the microelectromechanical resonator and/or introducing additional phase shift in an oscillation loop. The continuous tuning of resonance frequency can be achieved by modifying the acoustic properties of the resonating structure by changing the electrical and/or mechanical stiffness of the resonating portion of the oscillator. Unfortunately, techniques for modifying acoustic properties by electrostatic and thermal tuning typically require relatively large DC voltages and increase power consumption. The absence of a polarization voltage also makes these techniques impractical for resonators requiring piezoelectric transduction.

Techniques to provide additional phase shift in the oscillation loop typically include using tunable/variable capacitors placed in parallel ("parallel tuning") or series ("series tuning") with the resonator. Parallel tuning usually changes the feedthrough capacitance to thereby cause a shift in the anti-resonance of the resonating element. The shift in anti-resonance will indirectly impact the resonance frequency, but the tuning range is mainly limited to the difference between the resonance (when the feedthrough is completely cancelled) and the anti-resonance frequency.

In contrast, series tuning provides the possibility of a theoretically unlimited tuning range. Thus, as illustrated by FIG. 1, in a laterally-vibrating microelectromechanical resonator, which may be modeled as a series RLC tank circuit 18 with relatively large parasitic shunt capacitors 15a, 15b (e.g., $C_p \approx 2$ pF), series tuning can involve placing a tuning network 10 in series with the resonator as the most efficient way to change resonant frequency. This tuning network 10 is illustrated as including a transimpedance amplifier 12 with tunable gain (provided by $R_F$ and $C_{TUNE}$) and a voltage amplifier 14, which may drive an off-chip buffer 16. Unfortunately, the presence of the relatively large parasitic shunt capacitances may significantly reduce the tuning range to a level below what is necessary for adequate temperature compensation.

SUMMARY OF THE INVENTION

Integrated circuit oscillators according to embodiments of the present invention include microelectromechanical (MEM) resonators therein with parasitic impedance cancellation. According to some of these embodiments of the invention, an oscillator includes a microelectromechanical resonator having first and second terminals, such as an input terminal and output terminal. An oscillation sustaining circuit is also provided. The oscillation sustaining circuit is electrically coupled between the first and second terminals of the microelectromechanical resonator. The oscillation sustaining circuit includes a sustaining amplifier and a negative impedance circuit electrically coupled to the sustaining amplifier. The negative impedance circuit is configured to increase a tuning range of the oscillator by at least partially cancelling a parasitic shunt capacitance associated with the microelectromechanical resonator.

According to some of these embodiments of the invention, the negative impedance circuit includes a load capacitor and a negative impedance converter (NIC). In addition, the sustaining amplifier may include at least one tuning capacitor having a first terminal electrically connected to a first terminal of the load capacitor within the negative impedance circuit. The sustaining amplifier may also include a transimpedance amplifier having an input electrically connected to a second terminal of the at least one tuning capacitor.

According to additional embodiments of the present invention, the negative impedance converter includes a voltage divider and a first transistor having a first current carrying terminal electrically connected to an intermediate node of the voltage divider. The negative impedance converter also includes a second transistor having a gate terminal connected to the intermediate node. This second transistor has a first current carrying terminal (e.g., drain terminal) electrically connected to an electrode of the load capacitor and a second current carrying terminal (e.g., source terminal) electrically connected to a terminal of the microelectromechanical resonator.

According to still further embodiments of the invention, an oscillator is provided with a laterally-vibrating MEMs resonator and an oscillation sustaining circuit electrically coupled to the laterally-excited MEMs resonator. The oscillation sustaining circuit also includes a first negative impedance circuit electrically coupled to a first terminal of the laterally-excited MEMs resonator. A second negative impedance circuit may also be provided, which is electrically coupled to a second terminal of the laterally-excited MEMs resonator.

DESCRIPTION OF PREFERRED EMBODIMENTS

Figure 1:
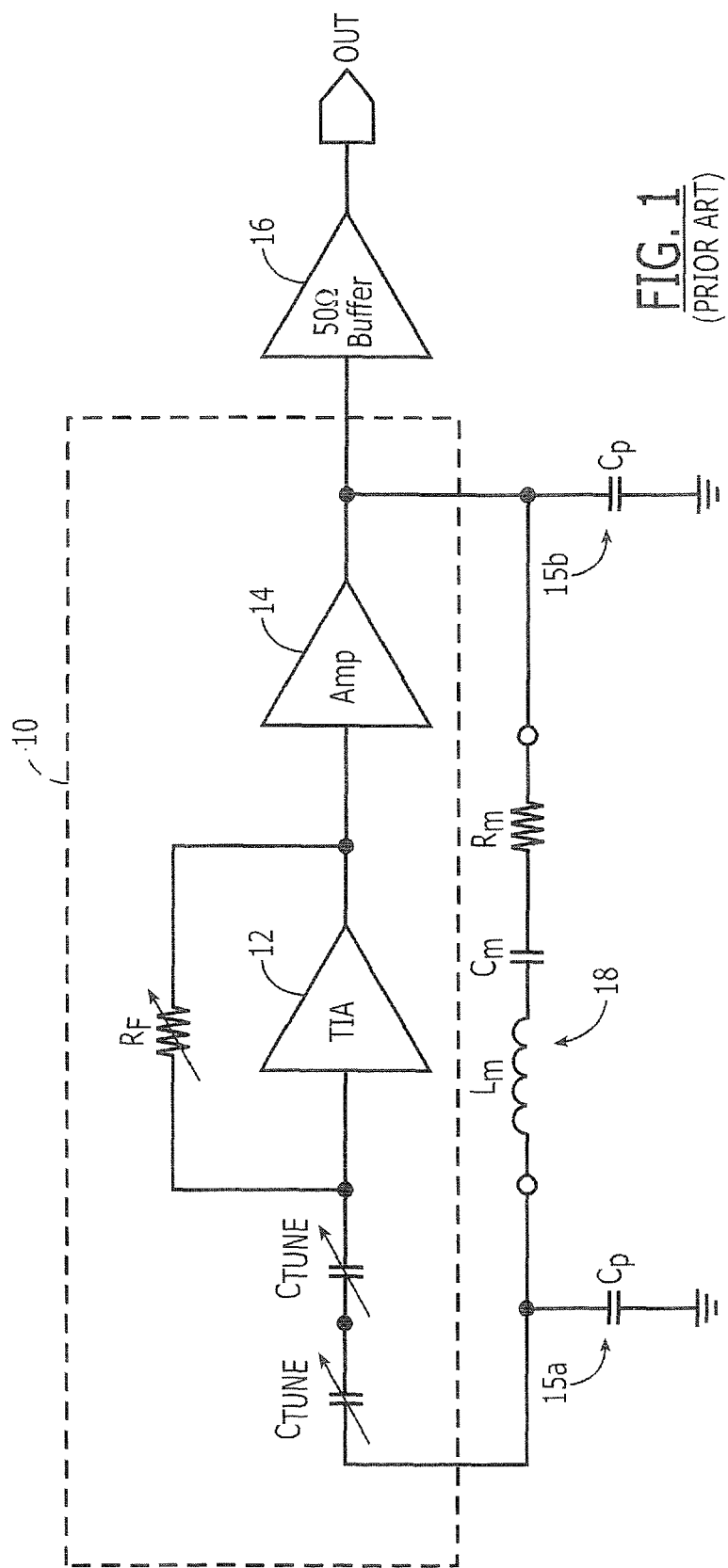
FIG. 1 is an electrical schematic of an integrated circuit oscillator having a microelectromechanical resonator and an oscillation sustaining circuit therein, according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
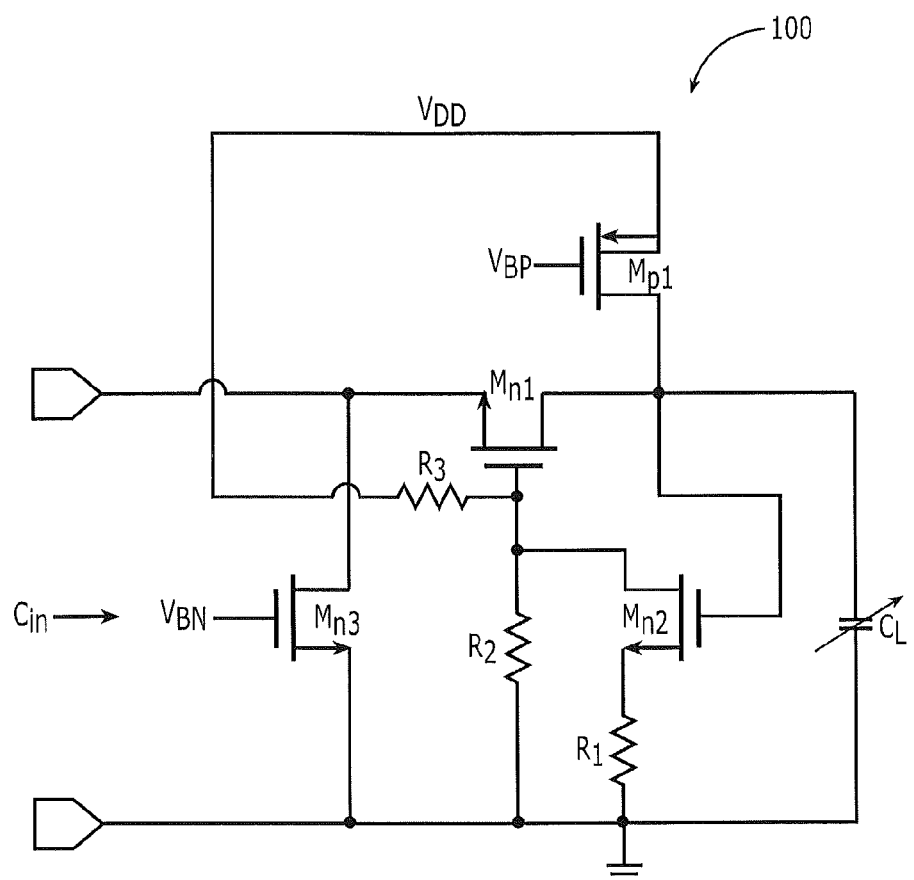
FIG. 2A is an electrical schematic of a negative impedance circuit according to an embodiment of the present invention.
Figure 2B:
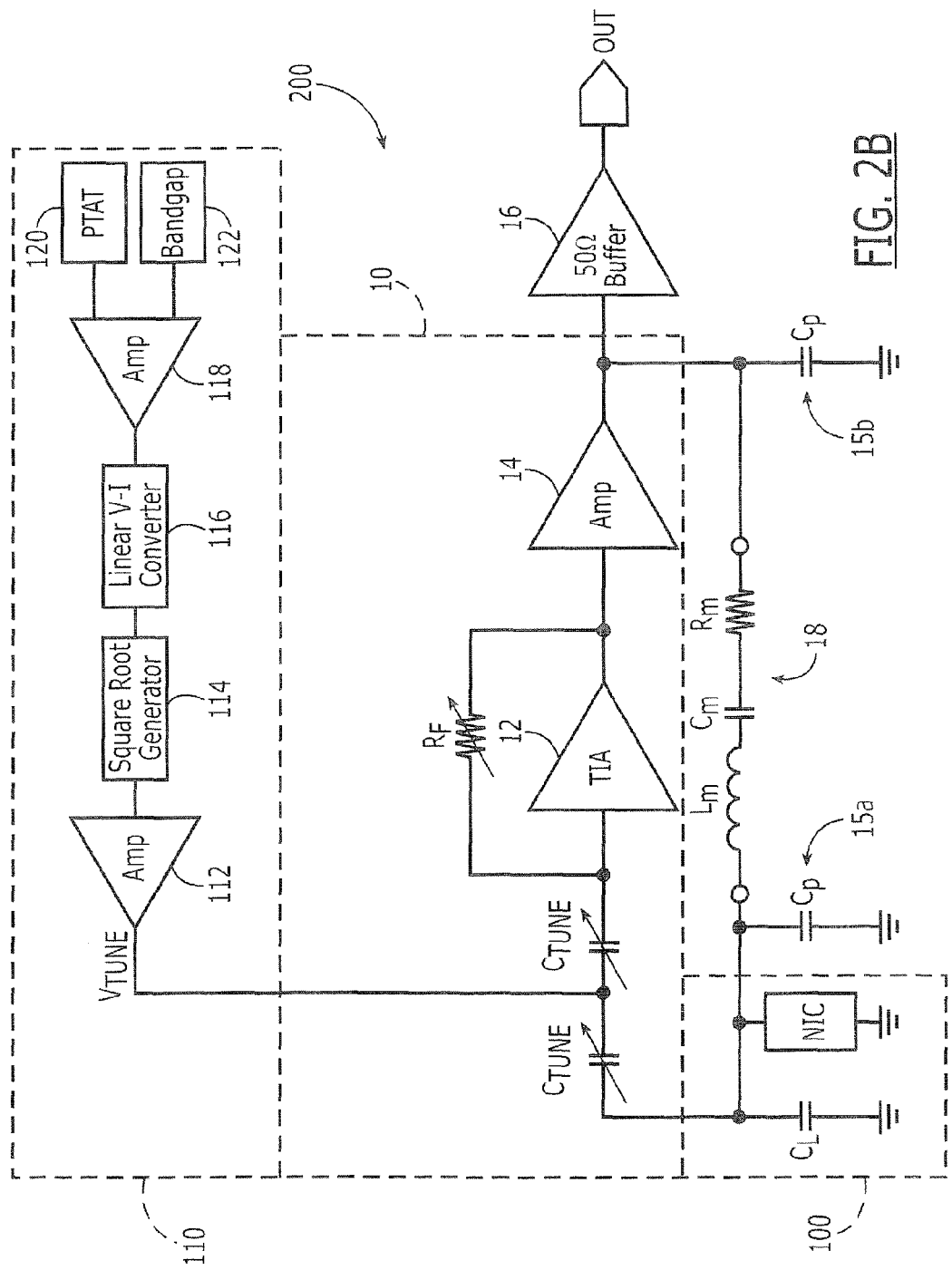
FIG. 2B is an electrical schematic of an integrated circuit oscillator having a microelectromechanical resonator, an oscillation sustaining circuit and a temperature compensation circuit therein, according to an embodiment of the present invention.

FIGS. 2A-2B illustrate a negative impedance circuit 100 according to an embodiment of the present invention. This negative impedance circuit 100 includes a load capacitor $C_L$ and a single-port negative impedance converter (NIC), which includes NMOS transistors $M_{n1}$–$M_{n3}$, PMOS transistor $M_{p1}$ and resistors $R_1$–$R_3$, connected as illustrated. The resistors $R_2$–$R_3$ operate as a voltage divider that generates a biasing voltage at a gate terminal of NMOS transistor $M_{n-1}$, which is equivalent to $V_{DD}(R_2/(R_2+R_3))$ where $V_{DD}$ is a power supply voltage having a magnitude of about 1.8 Volts. This voltage divider also provides a current path for the drain terminal of $M_{n2}$. The gate terminal of NMOS transistor $M_{n3}$ is responsive to a first bias signal ($V_{BN}$) and the gate terminal of PMOS transistor $M_{p1}$ is responsive to a second bias signal ($V_{BP}$). The first and second bias signals may have magnitudes equivalent to 0.9 Volts. By sizing the NMOS transistors $M_{n1}$ and $M_{n2}$ appropriately such that $g_{m-N1}=g_{m-N2}=g_m$, the capacitance at the input of the negative impedance circuit 100 can be calculated as follows:

$$C_{in}=-[(1+R_1 g_m)/(R_2 \| R_3)g_m]C_L \approx -[R_1/(R_2 \| R_3)]C_L, \quad (1)$$

where $g_m$ is the transconductance of transistors $M_{n1}$ and $M_{n2}$. Thus, by proper sizing of the resistor network including resistors $R_1$–$R_3$, the input capacitance $C_{in}$ of the negative impedance circuit 100 can be matched to the parasitic shunt capacitance 15a at an input of a microelectromechanical (MEM) resonator, such as a laterally-excited MEMs resonator. This matching operates to minimize the frequency drift of the oscillator over a commercial temperature range by cancelling at least a substantial portion of the parasitic shunt capacitance 15a.

Figure 3:
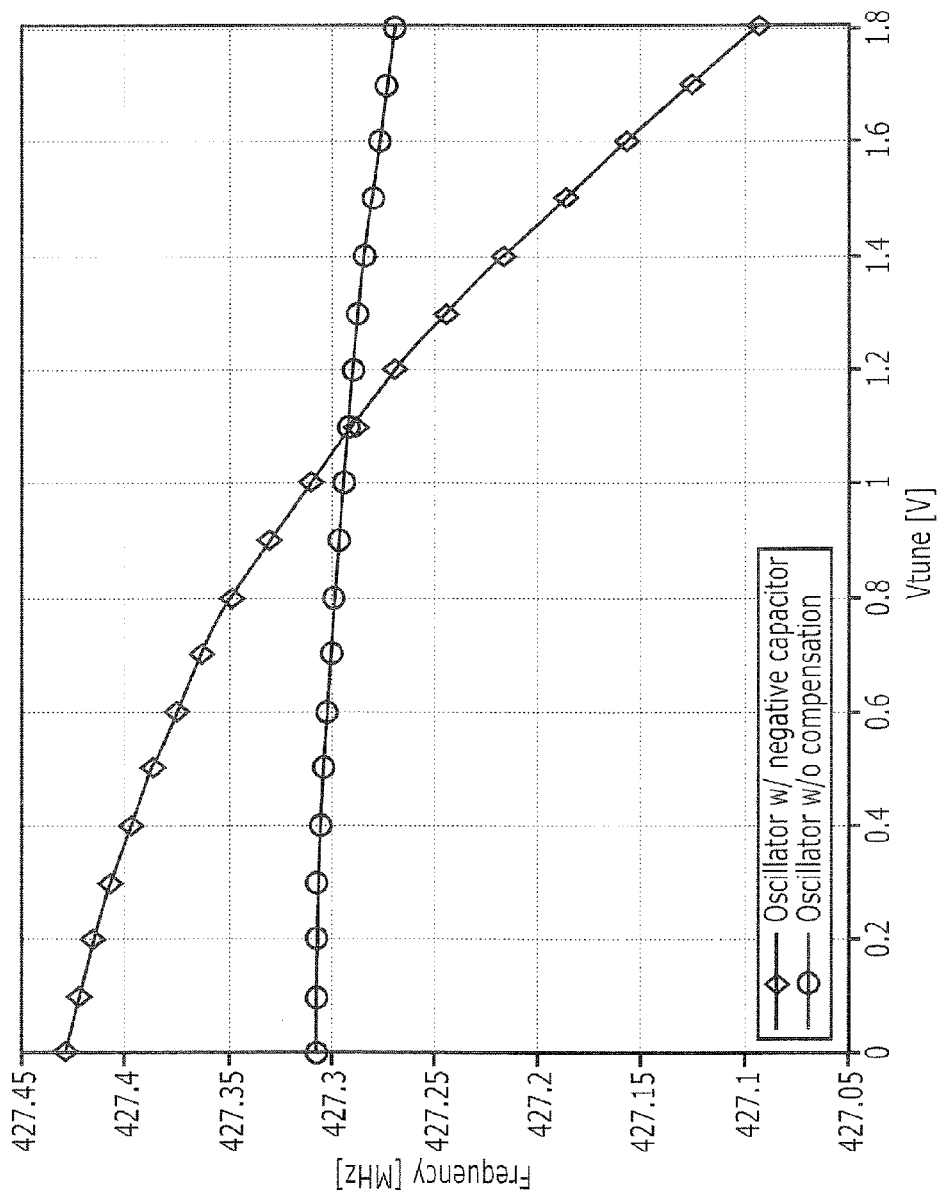
FIG. 3 is a graph of resonance frequency versus tuning voltage ($V_{TUNE}$) for a microelectromechanical oscillators configured with and without parasitic impedance cancellation.

Referring now to the tuned and temperature compensated oscillator 200 of FIG. 2B, the negative impedance circuit 100 is coupled to an input of a tuning network 10, which is illustrated as including a transimpedance amplifier 12 with tunable gain (provided by $R_F$, $C_{TUNE}$ and a tuning voltage $V_{TUNE}$) and a voltage amplifier 14, which may drive an off-chip buffer 16. By including the negative impedance circuit 100, improved tuning performance can be achieved. This improvement is illustrated by FIG. 3, which is a graph of resonant frequency versus tuning voltage ($V_{TUNE}$) for a microelectromechanical oscillator configured with and without parasitic impedance cancellation using the negative impedance circuit described herein. Although not shown in FIG. 2B, a second negative impedance circuit may also be provided to cancel the parasitic shunt capacitance 15b at an output of the MEMs resonator, which is modeled as the series RLC tank circuit 18. This addition of the second negative impedance circuit operates to further improve the tuning range of the MEMs resonator, but at the expense of higher signal attenuation, which forces higher power consumption, and reduced dynamic range.

FIG. 2B further illustrates a temperature compensation circuit 110 that can be used to further compensate for temperature drift of the resonator. This temperature compensation circuit 110 includes a PTAT voltage generator 120 and a bandgap voltage generator 122, which provide inputs to an amplifier 118 that drives a voltage-to-current converter 116. A square-root generator 114 and an amplifier 112 are also provided in series to generate a tuning voltage $V_{TUNE}$ in response to an output of the converter 116. These and other aspects of the temperature compensation circuit 110 are more fully disclosed in the aforementioned article by G. Ho et al., entitled "Temperature Compensated IBAR Reference Oscillators," Proc. IEEE-ASME MEMS 2006, pp. 910-913, Jan. 22-26, 2006. Still further aspects of PTAT and bandgap voltage generators are described in commonly assigned U.S. application Ser. No. 12/112,933, filed Apr. 30, 2008 and Ser. No.

12/494,935, filed Jun. 30, 2009, the disclosures of which are hereby incorporated herein by reference.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An oscillator, comprising:
a microelectromechanical resonator having an input and an output; and
an oscillation sustaining circuit electrically coupled to the input and output of said microelectromechanical resonator, said oscillation sustaining circuit comprising a sustaining amplifier and a negative impedance circuit electrically coupled to said sustaining amplifier, said negative impedance circuit comprising a load capacitor and a negative impedance converter electrically coupled to the load capacitor, said negative impedance circuit having an input capacitance that is both matched to a parasitic shunt capacitance at an input of said microelectromechanical resonator and greater in magnitude than a capacitance of the load capacitor by an amount determined by said negative impedance converter.

2. The oscillator of claim 1, wherein the sustaining amplifier comprises a transimpedance amplifier.

3. The oscillator of claim 1, wherein the sustaining amplifier comprises a tuning capacitor having a first terminal electrically connected to a first terminal of the load capacitor.

4. The oscillator of claim 3, wherein the sustaining amplifier comprises a transimpedance amplifier having an input electrically connected to a second terminal of the tuning capacitor.

5. An oscillator, comprising:
a microelectromechanical resonator; and
an oscillation sustaining circuit electrically coupled to said microelectromechanical resonator, said oscillation sustaining circuit comprising a negative impedance circuit electrically coupled to said microelectromechanical resonator, said negative impedance circuit comprising a load capacitor and a negative impedance converter electrically coupled to the load capacitor, said negative impedance circuit having an input capacitance that is both matched to a parasitic shunt capacitance at an input of said microelectromechanical resonator and greater in magnitude than a capacitance of the load capacitor by an amount determined by said negative impedance converter.

6. An oscillator, comprising:
a microelectromechanical resonator; and
an oscillation sustaining circuit electrically coupled to said microelectromechanical resonator, said oscillation sustaining circuit comprising a negative impedance circuit electrically coupled to said microelectromechanical resonator;
wherein the negative impedance circuit comprises a negative impedance converter and a load capacitor; and
wherein the negative impedance converter comprises a voltage divider and a first transistor having a first current carrying terminal electrically connected to an intermediate node of the voltage divider.

7. The oscillator of claim 6, wherein the negative impedance converter further comprises a second transistor having a gate terminal connected to the intermediate node.

8. The oscillator of claim 7, wherein the second transistor has a first current carrying terminal electrically connected to an electrode of the load capacitor.

9. The oscillator of claim 8, wherein the second transistor has a second current carrying terminal electrically connected to a terminal of said microelectromechanical resonator.

10. The oscillator of claim 6, wherein the voltage divider comprises a plurality of resistors; and wherein the negative impedance converter is configured so that an input capacitance thereof is greater than a magnitude of the load capacitor by an amount determined at least in part on values of the plurality of resistors.

11. The oscillator of claim 10, wherein the voltage divider comprises a plurality of resistors; and wherein the negative impedance converter is configured so that an input capacitance thereof is greater than a magnitude of the load capacitor by an amount proportional to a parallel resistance of two of the plurality of resistors.

12. An oscillator, comprising:
a laterally-vibrating MEMs resonator; and
an oscillation sustaining circuit electrically coupled to said laterally-excited MEMs resonator, said oscillation sustaining circuit comprising a first negative impedance circuit electrically coupled to a first terminal of said laterally-excited MEMs resonator;
wherein the first negative impedance circuit comprises a negative impedance converter and a load capacitor; and
wherein the negative impedance converter comprises a voltage divider and a first transistor having a first current carrying terminal electrically connected to an intermediate node of the voltage divider.

13. The oscillator of claim 12, wherein the voltage divider comprises a plurality of resistors; and wherein the negative impedance converter is configured so that an input capacitance thereof is greater than a magnitude of the load capacitor by an amount determined at least in part on values of the plurality of resistors.

14. The oscillator of claim 12, wherein the voltage divider comprises a plurality of resistors; and wherein the negative impedance converter is configured so that an input capacitance thereof is greater than a magnitude of the load capacitor by an amount proportional to a parallel resistance of two of the plurality of resistors.

* * * * *